United States Patent
Zhou et al.

(10) Patent No.: US 10,515,815 B2
(45) Date of Patent: Dec. 24, 2019

(54) ATOMIC LAYER DEPOSITION AND ETCH IN A SINGLE PLASMA CHAMBER FOR FIN FIELD EFFECT TRANSISTOR FORMATION

(71) Applicant: Lam Research Corporation, Fremont, CA (US)

(72) Inventors: Xiang Zhou, Santa Clara, CA (US); Ganesh Upadhyaya, Pleasanton, CA (US); Yoshie Kimura, Castro Valley, CA (US); Weiye Zhu, Fremont, CA (US); Zhaohong Han, Union City, CA (US); Seokhwan Lee, San Jose, CA (US); Noel Sun, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/820,263

(22) Filed: Nov. 21, 2017

(65) Prior Publication Data
US 2019/0157096 A1    May 23, 2019

(51) Int. Cl.
*H01L 21/3065*    (2006.01)
*H01L 21/02*    (2006.01)
(Continued)

(52) U.S. Cl.
CPC .. *H01L 21/30655* (2013.01); *C23C 16/45527* (2013.01); *C23C 16/45544* (2013.01);
(Continued)

(58) Field of Classification Search
CPC ............. H01J 37/32311; H01J 37/3222; H01J 37/32229; H01J 37/3065; H01J 37/32899; H01J 37/32422; H01J 37/32449; H01J 37/32651; H01L 21/3065; H01L 21/30655; H01L 21/6831; H01L 21/67069;
(Continued)

(56) References Cited

U.S. PATENT DOCUMENTS

| 8,334,083 B2 | 12/2012 | Luong et al. |
| 9,171,716 B2 | 10/2015 | Fukuda |

(Continued)

FOREIGN PATENT DOCUMENTS

WO    WO 2017/048275 A1    3/2017

OTHER PUBLICATIONS

U.S. Appl. No. 15/820,108, filed Nov. 21, 2017, Zhou et al.
(Continued)

*Primary Examiner* — Lan Vinh
(74) *Attorney, Agent, or Firm* — Weaver Austin Villeneuve & Sampson LLP (57) ABSTRACT

Methods and apparatuses for passivating a fin field effect transistor (FinFET) semiconductor device and performing a gate etch using integrated atomic layer deposition (ALD) and etch processes are described herein. Methods include performing a partial gate etch, depositing a passivation layer on exposed surfaces of semiconductor fins and a gate layer by ALD, and performing a final gate etch to form one or more gate structures of the FinFET semiconductor device. The etch, deposition, and etch processes are performed in the same plasma chamber. The passivation layer is deposited on sidewalls of the gate layer to maintain a gate profile of the one or more gate structures during etching.

17 Claims, 7 Drawing Sheets

(51) Int. Cl.
*H01L 21/311* (2006.01)
*H01L 21/67* (2006.01)
*H01J 37/32* (2006.01)
*C23C 16/455* (2006.01)
*H01L 21/683* (2006.01)

(52) U.S. Cl.
CPC .. *H01J 37/32422* (2013.01); *H01J 37/32449* (2013.01); *H01J 37/32651* (2013.01); *H01J 37/32899* (2013.01); *H01L 21/0228* (2013.01); *H01L 21/31116* (2013.01); *H01L 21/67069* (2013.01); *H01L 21/67207* (2013.01); *H01L 21/6831* (2013.01)

(58) Field of Classification Search
CPC ......... H01L 21/67207; H01L 21/31116; H01L 21/0228; H01L 21/0337; H01L 21/02323; C23C 16/45544; C23C 16/45527; C08K 5/098; C08L 21/00; C08L 9/06
USPC ........ 438/710.712, 714, 715, 723, 706, 756, 438/258, 265, 287, 700, 710, 712; 156/345.35, 345.36, 345.39, 345.41
See application file for complete search history.

(56) References Cited

U.S. PATENT DOCUMENTS

| | | | |
|---|---|---|---|
| 9,269,590 | B2 | 2/2016 | Luere et al. |
| 9,576,811 | B2 | 2/2017 | Kanarik et al. |
| 9,805,941 | B2 | 10/2017 | Kanarik et al. |
| 9,806,252 | B2 | 10/2017 | Tan et al. |
| 9,870,899 | B2 | 1/2018 | Yang et al. |
| 9,997,371 | B1 | 6/2018 | Agarwal et al. |
| 9,997,631 | B2* | 6/2018 | Yang ................ H01L 21/31111 |
| 10,074,543 | B2 | 9/2018 | Mahorowala et al. |
| 2005/0048785 | A1 | 3/2005 | Kang et al. |
| 2006/0226120 | A1 | 10/2006 | Rusu et al. |
| 2007/0196980 | A1 | 8/2007 | Subramanian |
| 2008/0230947 | A1 | 9/2008 | Chou et al. |
| 2009/0197420 | A1 | 8/2009 | Luong et al. |
| 2009/0206443 | A1* | 8/2009 | Juengling ......... H01L 27/10876 257/506 |
| 2009/0233446 | A1* | 9/2009 | Sakao ............... H01L 21/28088 438/694 |
| 2009/0246965 | A1 | 10/2009 | Mori et al. |
| 2009/0275205 | A1 | 11/2009 | Kiehlbauch et al. |
| 2010/0173496 | A1 | 7/2010 | Zhong et al. |
| 2010/0323525 | A1 | 12/2010 | Chi et al. |
| 2012/0264305 | A1 | 10/2012 | Nakano |
| 2013/0189845 | A1 | 7/2013 | Kim et al. |
| 2013/0323923 | A1 | 12/2013 | Koehler et al. |
| 2014/0083978 | A1 | 3/2014 | Mahadeswaraswamy et al. |
| 2014/0213037 | A1 | 7/2014 | LiCausi et al. |
| 2014/0252478 | A1 | 9/2014 | Doornbos et al. |
| 2015/0102386 | A1 | 4/2015 | Chen et al. |
| 2015/0187602 | A1 | 7/2015 | Kim et al. |
| 2015/0249018 | A1 | 9/2015 | Park et al. |
| 2015/0322569 | A1* | 11/2015 | Kilpi .................... C23C 16/403 427/569 |
| 2015/0380272 | A1 | 12/2015 | Wu et al. |
| 2016/0056270 | A1 | 2/2016 | Dal |
| 2016/0064379 | A1* | 3/2016 | Yu ..................... H01L 21/0223 257/192 |
| 2016/0111309 | A1* | 4/2016 | Lill ................... H01L 21/67766 414/217 |
| 2016/0126243 | A1* | 5/2016 | Weis ................. H01L 27/0883 257/392 |
| 2016/0307769 | A1 | 10/2016 | Tseng et al. |
| 2016/0314985 | A1 | 10/2016 | Yang et al. |
| 2016/0336178 | A1 | 11/2016 | Swaminathan et al. |
| 2016/0365425 | A1 | 12/2016 | Chen et al. |
| 2016/0379824 | A1 | 12/2016 | Wise et al. |
| 2017/0229314 | A1 | 8/2017 | Tan et al. |
| 2017/0323831 | A1 | 11/2017 | Jeong et al. |
| 2018/0019387 | A1 | 1/2018 | Tan et al. |
| 2018/0033635 | A1 | 2/2018 | Kanarik et al. |
| 2018/0061650 | A1 | 3/2018 | Mahorowala et al. |
| 2018/0090491 | A1 | 3/2018 | Huang et al. |
| 2018/0240667 | A1 | 8/2018 | Yu et al. |
| 2018/0308680 | A1 | 10/2018 | Reddy et al. |
| 2019/0067120 | A1 | 2/2019 | Ching et al. |
| 2019/0109002 | A1 | 4/2019 | Mattinen et al. |
| 2019/0148501 | A1 | 5/2019 | Chen et al. |
| 2019/0157066 | A1 | 5/2019 | Zhou et al. |
| 2019/0157095 | A1 | 5/2019 | Zhou et al. |
| 2019/0237330 | A1 | 8/2019 | Abatchev et al. |

OTHER PUBLICATIONS

U.S. Appl. No. 15/820,110, filed Nov. 21, 2017, Zhou et al.
U.S. Appl. No. 15/719,484, filed Sep. 28, 2017, Kanarik et al.
U.S. Appl. No. 15/719,497, filed Sep. 28, 2017, Tan et al.
U.S. Appl. No. 15/582,359, filed Apr. 28, 2017, Agarwal et al.
U.S. Appl. No. 15/581,951, filed Apr. 28, 2017, Reddy et al.
U.S. Appl. No. 15/881,506, filed Jan. 26, 2018, Abatchev.
U.S. Office Action dated Dec. 14, 2018 issued in U.S. Appl. No. 15/881,506.
International Search Report and Written Opinion dated Mar. 6, 2019 in Application No. PCT/US2018/060732.
International Search Report and Written Opinion dated Mar. 6, 2019 in Application No. PCT/US2018/060739.
International Search Report and Written Opinion dated Mar. 5, 2019 in Application No. PCT/US2018/060743.
International Search Report and Written Opinion dated May 14, 2019 in Application No. PCT/US2019/014580.
U.S. Notice of Allowance dated Mar. 8, 2019 issued in U.S. Appl. No. 15/881,506.
Office Action dated Jul. 15, 2019, issued in U.S. Appl. No. 15/820,108.
Office Action dated Sep. 9, 2019, issued in U.S. Appl. No. 15/820,110.
U.S. Notice of Allowance dated Jul. 3, 2019 issued in U.S. Appl. No. 15/881,506.

* cited by examiner

ATOMIC LAYER DEPOSITION AND ETCH IN A SINGLE PLASMA CHAMBER FOR FIN FIELD EFFECT TRANSISTOR FORMATION

TECHNICAL FIELD

This disclosure relates generally to integrated deposition and etch processes in fabrication of semiconductor devices and, more particularly, to integrated atomic layer deposition (ALD) and etch processes during fin field effect transistor (FinFET) formation.

BACKGROUND

As device and features size continue to shrink in the semiconductor industry, challenges have developed in three-dimensional designs, such as in FinFETs. FinFETs are fabricated with a thin vertical "fin" or fin structure extending from a substrate. A channel is formed in the vertical fin structure, and a gate is provided over the vertical fin structure. FinFETs may reduce short channel effects and result in higher current flow.

SUMMARY

This disclosure pertains to a method of performing in-situ ALD and etch during FinFET semiconductor device formation. The method includes etching, in a plasma chamber, a gate layer of a FinFET semiconductor device to one or more top surfaces of one or more corresponding semiconductor fins of the FinFET semiconductor device. The method further includes depositing, in the plasma chamber, a first passivation layer by atomic layer deposition (ALD) on exposed surfaces of the gate layer and the one or more semiconductor fins. The method further includes etching, in the plasma chamber, the gate layer to a top surface of an insulating material layer of the FinFET semiconductor device to define one or more gate structures in the FinFET semiconductor device, where the one or more semiconductor fins run perpendicular to the one or more gate structures.

In some implementations, the gate layer includes polysilicon. In some implementations, etching the gate layer to the top surface of the insulating material layer includes etching a first portion of the gate layer to a first depth in the plasma chamber, depositing a second passivation layer by ALD on the exposed surfaces of the gate layer and the one or more semiconductor fins in the plasma chamber, and etching a second portion of the gate layer to the top surface of the insulating material layer in the plasma chamber. In some implementations, the method further includes defining the one or more semiconductor fins from a semiconductor substrate prior to etching the gate layer to the one or more top surfaces of the one or more corresponding semiconductor fins, and depositing the gate layer over and around an upper portion of the one or more semiconductor fins before etching the gate layer to the one or more top surfaces of the one or more corresponding semiconductor fins. In some implementations, the method further includes forming a gate mask over the gate layer prior to etching the gate layer to the one or more top surfaces of the one or more corresponding semiconductor fins, the gate mask defining regions for forming the one or more gate structures. The first passivation layer may be conformally deposited on sidewalls of the gate layer underlying the gate mask. In some implementations, a thickness of the first passivation layer is between about 0.5 nm and about 3 nm and a width of each of the gate structures is between about 5 nm and about 50 nm. In some implementations, an etchant is substantially free of an oxygen-containing gas in each of etching the gate layer to the one or more top surfaces of the one or more corresponding semiconductor fins and etching the gate layer to the top surface of the insulating material layer. The etchant may include a bromine-containing reagent, a chlorine-containing reagent, or combinations thereof. In some implementations, etching the gate layer to the one or more top surfaces of the one or more corresponding semiconductor fins and etching the gate layer to the top surface of the insulating material layer occur with minimal lateral critical dimension (CD) loss. In some implementations, etching the gate layer to the top surface of the insulating material layer removes the gate layer from each corner where the one or more gate structures, the one or more semiconductor fins, and the insulating material layer intersect. In some implementations, the first passivation layer includes silicon oxide ($SiO_x$). In some implementations, depositing the first passivation layer by ALD includes introducing a precursor into the plasma chamber to adsorb on the gate layer and the one or more top surfaces of the one or more corresponding semiconductor fins, converting the precursor with a plasma to form an adsorption-limited amount of the first passivation layer, and repeating operations of introducing the precursor and converting the precursor until a desired thickness of the first passivation layer is deposited on the exposed surfaces of the gate layer and the one or more semiconductor fins.

These and other aspects are described further below with reference to the drawings.

DETAILED DESCRIPTION

Introduction

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Integrated Etch/ALD Processing Apparatus

As feature sizes shrink, pitch becomes smaller, and complementary metal-oxide-semiconductor (CMOS) technology scales to smaller nodes, thin conformal deposition techniques will continue to gain importance. Atomic layer deposition (ALD) is a film forming technique which is well-suited to the deposition of thin conformal films due to the fact that ALD deposits a single thin layer of material, the thickness being limited by the amount of one or more precursor reactants which may adsorb onto a substrate surface (i.e., forming an adsorption-limited layer) prior to film-forming chemical reaction itself. Each layer formed by ALD is thin and conformal, with the resulting film substantially conforming to the shape of underlying device structures and features.

Conventionally, ALD and etch processes are performed on separate tools or platforms. For example, ALD chambers do not run etch processes, and etch chambers do not run ALD processes. Plasma etch chambers that run a deposition process use a plasma-induced deposition process to form films that are not conformal and that are aspect ratio dependent.

Figure 1:
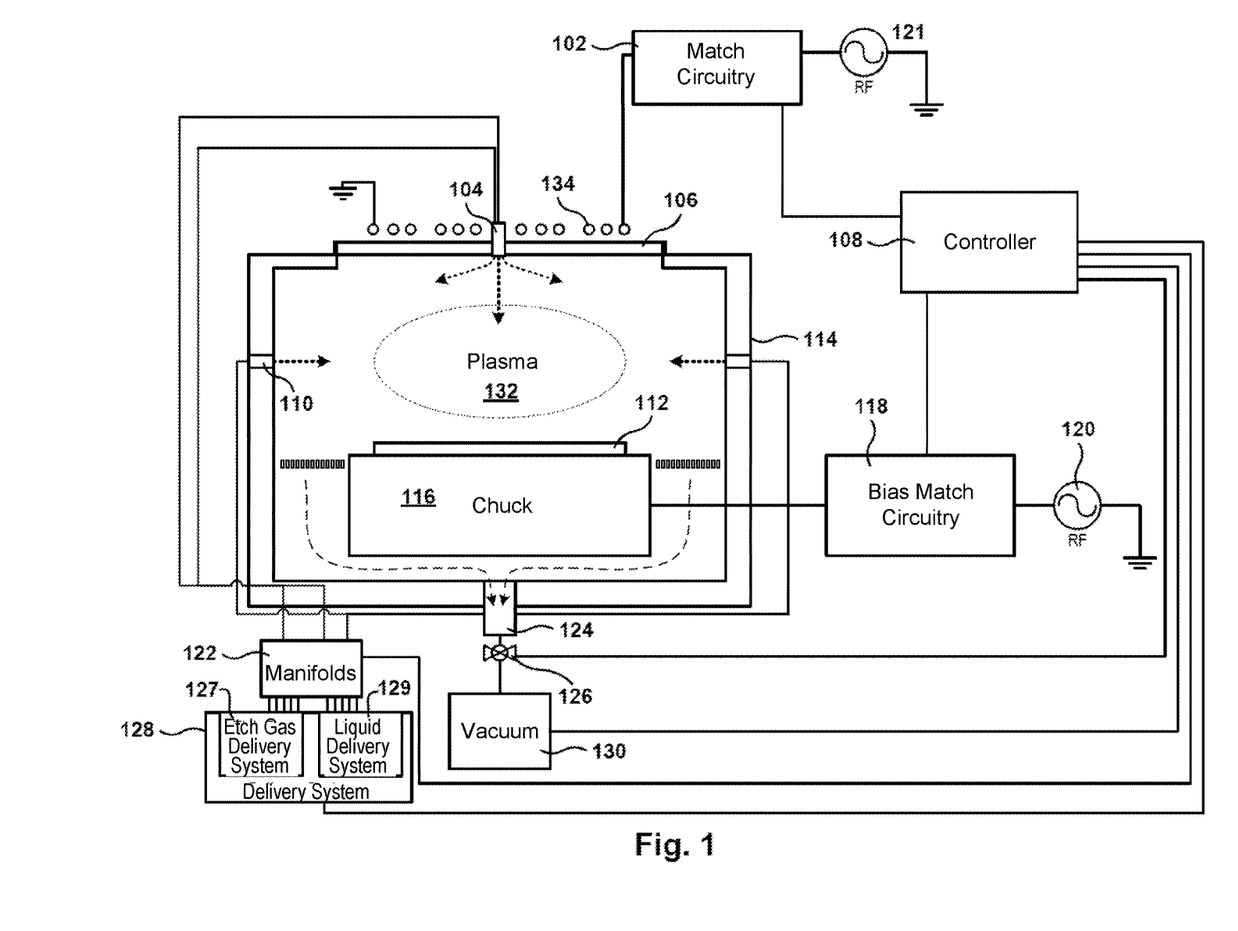
FIG. 1 is a schematic diagram of an example processing apparatus for performing etch and ALD operations according to some implementations.

FIG. 1 is a schematic diagram of an example processing apparatus for performing etch and ALD operations according to some implementations. The processing apparatus 100 may be an inductively coupled plasma processing apparatus. The processing apparatus 100 includes a plasma chamber 132 such as a plasma etch chamber. In some implementations, a Kiyo™ reactor, produced by Lam Research Corporation of Fremont, Calif., is an example of a suitable reactor that may be used as the plasma etch chamber.

Details regarding the processing apparatus 100 for performing etch and ALD operations are described in U.S. patent application Ser. No. 15/669,871, filed Aug. 4, 2017 to Zhou et al., and entitled "INTEGRATED ATOMIC LAYER PASSIVATION IN TCP ETCH CHAMBER AND IN-SITU ETCH-ALP METHOD," which is incorporated by reference in its entirety and for all purposes.

The plasma chamber 132 may include an overall chamber structure that may be defined by chamber walls 114 and a window 106. The window 106 may be fabricated from quartz or other dielectric material. In some implementations, the plasma chamber 132 includes a substrate support 116 disposed inside the plasma chamber 132. In some implementations, the substrate support 116 is an electrostatic chuck for supporting a substrate 112 upon which a deposition/etch process is performed. The electrostatic chuck may include electrostatic electrodes for chucking and dechucking the substrate 112. A filter and DC clamp power supply (not shown) may be provided for this purpose. Other control systems for lifting the substrate 112 off the substrate support 116 may also be provided. The substrate support 116 is configured to receive and hold the substrate 112.

In some implementations, the substrate support 116 may include a heater (not shown) to heat the substrate 112. The substrate support 116 may operate at elevated temperatures, such as between about 20° C. and about 150° C. The temperature will depend on the process operation and specific recipe. In some implementations, the plasma chamber 132 may also operate at certain pressures, such as pressures in between about 1 mTorr and about 1 Ton.

In some implementations, the processing apparatus 100 may include a radio-frequency (RF) power supply 120 that may be used for biasing/charging the substrate support 116. The RF power supply 120 may be defined by one or more RF generators. If multiple RF generators are provided, different frequencies may be used to achieve various tuning characteristics. A bias matching circuitry 118 is coupled between the RF power supply 120 and the substrate support 116. In this manner, the RF power supply 120 is connected to the substrate support 116.

A coil 134 is positioned over the window 106. The coil 134 may be fabricated from an electrically conductive material and includes at least one complete turn. The coil 134 shown in FIG. 1 includes at least three turns. An RF power supply 121 is configured to supply RF power to the coil 134. A matching circuitry 102 is coupled between the RF power supply 121 and the coil 134. In this manner, the RF power supply 121 is connected to the coil 134. In some implementations, an optional Faraday shield (not shown) is positioned between the coil 134 and the window 106. The Faraday shield may be maintained in a spaced apart relationship relative to the coil 134. The Faraday shield may be disposed immediately above the window 106. The Faraday shield may prevent metal or other species from depositing on the window 106 of the plasma chamber 132.

RF power is supplied from the RF power supply 121 to the coil 134 to cause an RF current to flow through the coil 134. The RF current flowing through the coil 134 may generate an electromagnetic field about the coil 134. The electromagnetic field generates an inductive current within the plasma chamber 132 that acts on the gas(es) present in the plasma chamber 132 to produce a plasma. Various ions and/or radicals from the plasma may interact with the substrate 112 to perform a deposition or etch operation.

In some implementations, the processing apparatus 100 optionally includes a plasma grid (not shown) that may be used to divide the plasma chamber 132 into an upper portion and a lower portion. The plasma grid may be used to limit the amount of hot electrodes into the lower portion of the plasma chamber 132. In some implementations, the processing apparatus 100 is designed to operate such that plasma present in the lower portion of the plasma chamber 132 is an ion-ion plasma and the plasma present in the upper portion of the plasma chamber 132 is an electron-ion plasma.

Process gases may be introduced into the plasma chamber 132 through a first gas injector 104 from the top of the plasma chamber 132 and/or through a second gas injector 110 from the side of the plasma chamber 132. Process gases may include vaporized liquid precursors or vaporized solid precursors, which may be vaporized in a solid source evaporator (not shown) upstream of the processing apparatus 100. One or more reactant gases may be supplied through the first gas injector 104 and/or second gas injector 110. In some implementations, the gas injectors 104, 110 may be replaced by showerheads. It will be understood that additional or other gas supplies may be provided for supplying different gases to the plasma chamber 132 for various types of operations.

The various ways of injecting gas(es) into the plasma chamber 132 show that process gases, vaporized liquid precursors, and/or vaporized solid precursors may be provided into the plasma chamber 132 from various locations. In some implementations, only the first gas injector 104 is used. In some other implementations, only the second gas injector 110 is used. In some other implementations, both the first gas injector 104 and the second gas injector 110 are used. In some implementations, manifolds 122 control which gases are supplied to each of the different gas lines. Manifolds 122 allow for any type of gas (reactant, carrier, precursor, etc.) to be provided from any of the different gas lines. In some implementations, carrier gases can include gases such as oxygen ($O_2$), nitrogen ($N_2$), and helium (He). The gases may be introduced into the plasma chamber 132 without mixing or may be mixed with other gases before introduction into the plasma chamber 132.

Manifolds 122 may be used for selecting, switching, and/or mixing outputs from respective delivery systems in a delivery system 128. The delivery system 128 may, in some implementations, include an etch gas delivery system 127 and a liquid delivery system 129. The etch gas delivery system 127 may be configured to output etchant gases. Examples of etchant gases include but are not limited to chlorine ($Cl_2$), hydrogen bromide (HBr), and sulfur hexafluoride ($SF_6$). The liquid delivery system 129 may be configured to provide liquid precursor that is vaporized and delivered in vapor form in an ALD process. The vaporized liquid precursor may be introduced into the plasma chamber 132 and may adsorb onto a surface of the substrate 112. The adsorbed precursor may be converted to form an adsorption-limited amount of film using a plasma. An example liquid precursor may have a chemical composition of the formula: $C_xH_yN_zO_aSi_b$.

A vacuum pump 130 is connected to the plasma chamber 132 and may be used to draw out process gases from the plasma chamber 132 and to maintain a certain pressure within the plasma chamber 132. A valve 126 may be disposed between an exhaust 124 and the vacuum pump 130 to control the amount of vacuum suction being applied to the plasma chamber 132. In some implementations, the vacuum pump 130 can be a one or two stage mechanical dry pump and/or turbomolecular pump. In some implementations, the vacuum pump 130 may be activated after each time an ALD process is completed to purge the plasma chamber 132.

The processing apparatus 100 may be coupled to facilities (not shown) when installed in a clean room or a fabrication facility. Facilities include plumbing that provide processing gases, vacuum, temperature control, and environmental particle control. These facilities may be coupled to the processing apparatus 100 when installed in the target fabrication facility. Additionally, the processing apparatus 100 may be coupled to a transfer chamber that allows robotics to transfer substrates into and out of the plasma chamber 132 using automation.

In some implementations, a system controller 108 (which may include one or more physical or logical controllers) controls some or all of the operations of the processing apparatus 100. The system controller 108 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 108 they may be provided over a network. In certain implementations, the system controller 108 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the substrate (which in various implementations may be zero), the frequency and power applied to coils or other plasma generation components, substrate position, substrate movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 108. The instructions for setting process conditions for a phase may be included in a corresponding recipe phase, for example. In some implementations, the recipe phases may be sequentially arranged, such that steps in a doping process are executed in a certain order for that process phase. For example, a recipe may be configured to perform etch operations and include one or more cycles of an ALD process performed in between each of the etch operations.

In some implementations, the system controller 108 is configured with instructions for performing one or more of the following operations: etching, in the plasma chamber 132, a first layer of a substrate 112 to form a mask pattern of features, the mask pattern of features having a width that is less than a desired width of a plurality of structures to be formed by the mask pattern of features; depositing, in the plasma chamber 132, a first passivation layer on the mask pattern of features by ALD, the first passivation layer being deposited with a thickness that increases the width of the mask pattern of features to the desired width; and etching, in the plasma chamber 132, a second layer of the substrate 112 to form the plurality of structures having the desired width. The etching and depositing operations are performed without introducing a vacuum break in the plasma chamber 132. In some implementations, the system controller 108 is further configured to perform the following operation: repeating operations of depositing by ALD and etching in the plasma chamber 132.

Other computer software and/or programs may be employed in some embodiments. Examples of programs or sections of programs for this purpose include substrate positioning program, a process gas composition control program, a pressure control program, a heater control program, and an RF power supply control program.

In some cases, the system controller 108 controls gas concentration, substrate movement, and/or the power supplied to the coil 134 and/or substrate support 116. The system controller 108 may control the gas concentration by, for example, opening and closing relevant valves to produce one or more inlet gas stream that provide the necessary reactant(s) at the proper concentration(s). The substrate movement may be controlled by, for example, directing a substrate positioning system to move as desired. The power supplied to the coil 134 and/or substrate support 116 may be controlled to provide particular RF power levels. If a grid is used, the RF powers may be adjusted by the system controller 108 to create an electron-ion plasma in an upper portion of the plasma chamber 132 and ion-ion plasma in a lower portion of the plasma chamber 132. Further, the system controller 108 may be configured to supply power to the substrate support 116 under conditions such that an electron-ion plasma does not form in the lower portion of the plasma chamber 132.

The system controller 108 may control these and other aspects based on sensor output (e.g., when power, potential, pressure, etc. reach a certain threshold), the timing of an operation (e.g., opening valves at certain times in a process), or based on received instructions from the user.

In some implementations, a system controller 108 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 108, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the system controller 108 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 108 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller 108, in some implementations, may be a part of or coupled to a computer that is integrated with, coupled to the system, otherwise networked to the system, or a combination thereof. For example, the system controller 108 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 108 receives instructions in the form of data, which specify parameters for each of the processing steps to be performed during one or more operations. It should be understood that the parameters may be specific to the type of process to be performed and the type of tool that the system controller 108 is configured to interface with or control. Thus as described above, the system controller 108 may be distributed, such as by comprising one or more discrete controllers that are networked together and working towards a common purpose, such as the processes and controls described herein. An example of a distributed system controller 108 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the system controller 108 might communicate with one or more of other tool circuits or modules, other tool components, cluster tools, other tool interfaces, adjacent tools, neighboring tools, tools located throughout a factory, a main computer, another system controller 108, or tools used in material transport that bring containers of substrates to and from tool locations and/or load ports in a semiconductor manufacturing factory.

FinFET Semiconductor Devices

With shrinking device features and smaller pitches in semiconductor devices, the semiconductor industry is transitioning from planar complimentary metal-oxide semiconductor (CMOS) transistors to three-dimensional (3D) FinFET device architectures. FinFETs offer improved channel control and reduced short channel effects. Instead of having a gate positioned above the channel in a conventional planar transistor, FinFETs have a gate around the channel to provide electrostatic control on both sides. The 3D device architecture introduces parasitic capacitances and critical dimensions that present challenges to control with shrinking device features and smaller pitches. This results in scaling down of gate length and pitches, presenting challenges with current patterning methods.

Figure 2:
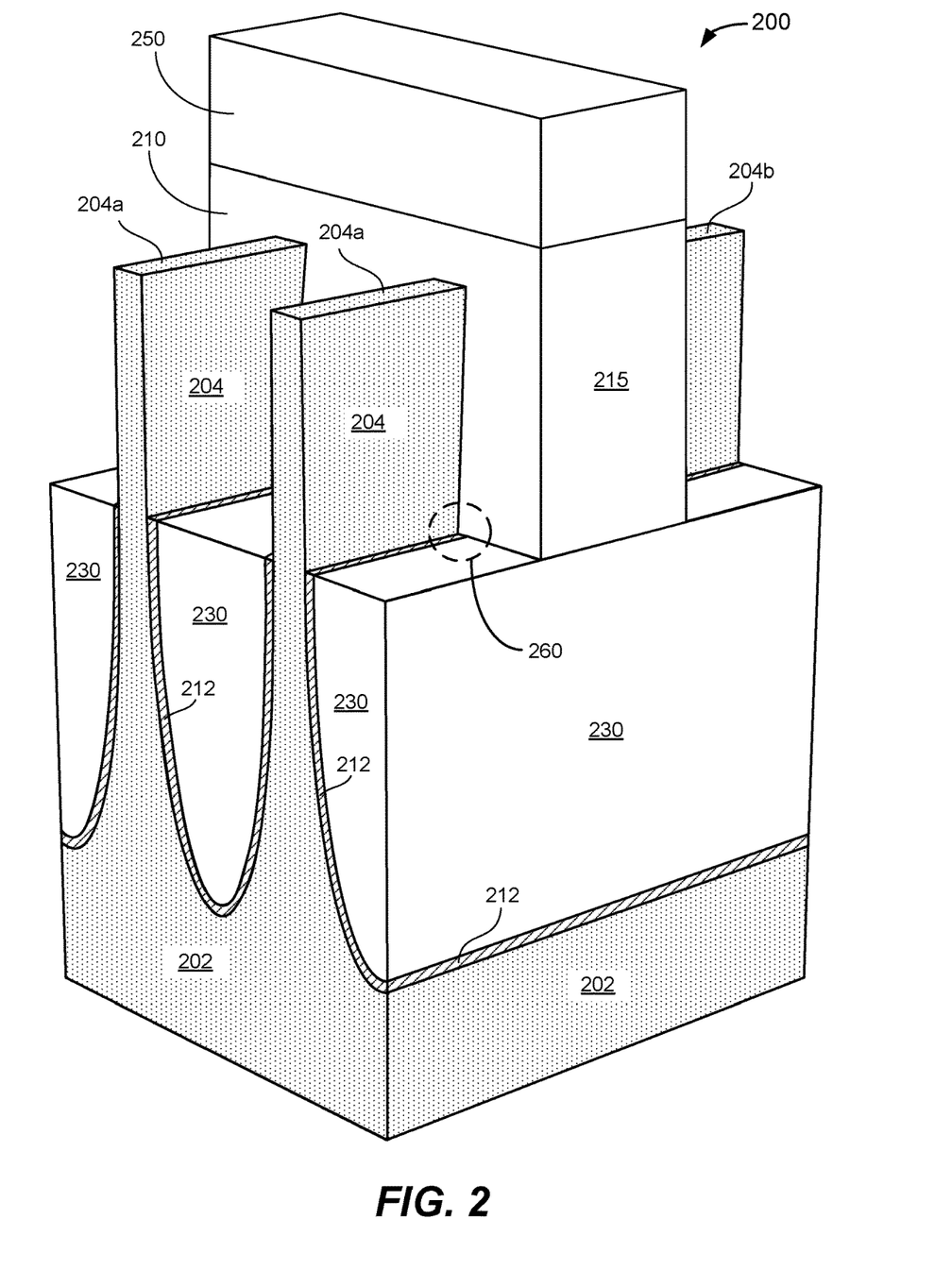
FIG. 2 is perspective view showing a three-dimensional schematic of an example FinFET semiconductor device.

FIG. 2 is perspective view showing a three-dimensional schematic of an example FinFET semiconductor device. The FinFET semiconductor device 200 includes a substrate 202, where the substrate 202 may be a semiconductor substrate. In some implementations, the substrate 202 includes a semiconducting material such as silicon, germanium, silicon germanium, indium antimonide, lead telluride, indium arsenide, indium phosphide, gallium arsenide, and gallium antimonide, among others. In some implementations, the substrate 202 can include a bulk silicon material or a silicon-on-insulator (SOI) structure.

The FinFET semiconductor device 200 further includes one or more semiconductor fins 204 (e.g., silicon fins) that extend from the substrate 202. The one or more semiconductor fins 204 may include any suitable semiconducting material. In some implementations, the one or more semiconductor fins 204 may be formed from the substrate 202 using a suitable patterning process, such as a lithography and etching process. In some implementations, the one or more semiconductor fins 204 may be doped through an implantation process to introduce p-type or n-type impurities into the one or more semiconductor fins 204.

The FinFET semiconductor device 200 further includes an insulating material layer 230 on the substrate 202 and surrounding at least a lower portion of the one or more semiconductor fins 204. An upper portion of the one or more semiconductor fins 204 may protrude from the insulating material layer 230. The insulating material layer 230 may be planarized so that an upper portion of the one or more semiconductor fins 204 extend above a top surface of the insulating material layer 230. The insulating material layer 230 may include any suitable insulating material such as silicon oxide ($SiO_x$) or silicon nitride ($Si_xN_y$). In some implementations, the insulating material layer 230 is an isolation structure, such as a shallow trench isolation (STI) structure. The isolation structure serves to limit electrical interference or cross-talk.

The FinFET semiconductor device 200 further includes a gate structure 210 over portions of the one or more semiconductor fins 204. In some implementations, the gate structure 210 may include a gate dielectric layer (not shown), one or more gate spacers (not shown), and a gate electrode 215. The gate electrode 215 may include an electrically conductive material such as polysilicon (poly-Si), polycrystalline silicon-germanium (poly-SiGe), metallic nitrides, metallic silicides, metallic oxides, or metals. In some implementations, the gate electrode 215 includes poly-Si. In some implementations, the gate structure 210 is formed over a central portion of each of the one or more semiconductor fins 204. In some implementations, multiple gate structures 210 are formed over multiple semiconductor fins 204. It will be understood that even though FIG. 2 shows only two semiconductor fins 204 and one gate structure 210, various implementations can include more or less semiconductor fins 204 and/or more gate structures 210.

The one or more semiconductor fins 204 may extend through opposite sides of the gate structure 210. The one or more semiconductor fins 204 may run perpendicular to the gate structure 210. The gate structure 210 may intersect sidewalls of the one or more semiconductor fins 204. In some implementations, the one or more semiconductor fins 204 may be substantially parallel to one another.

Surfaces 204a are top surfaces of the one or more semiconductor fins 204. Surfaces 204a of the one or more semiconductor fins 204 extending from one side of the gate structure 210 correspond to source regions, while surfaces 204b of the one or more semiconductor fins 204 extending from another side of the gate structure 210 correspond to drain regions. The gate structure 210 may be disposed over the channel region (not shown) of the FinFET semiconductor device 200, where the channel region is between the source and drain regions.

In some implementations, the FinFET semiconductor device 200 optionally includes a liner 212 that may separate the semiconductor material of the substrate 202 from the insulating material layer 230. In some implementations, the FinFET semiconductor device 200 optionally includes one or more gate dielectric layers (not shown) that is formed over the insulating material layer 230 that may separate the insulating material layer 230 from the gate structure 210. In some implementations, the FinFET semiconductor device 200 optionally includes a gate mask 250 over the gate structure 210. The gate mask 250 may include any suitable soft mask or hard mask material for protecting the gate structure 210 during various patterning processes. In some implementations, the gate mask 250 includes a hard mask material such as silicon oxide, silicon nitride, silicon oxynitride, or other applicable material. The gate mask 250 may remain intact after etching processes to form the gate structure 210 and expose the one or more semiconductor fins 204.

An etching operation may be applied in forming the outline of the final gate structure 210. In some implementations, a plasma etching process etches through gate material to form the final gate structure 210. This process may be referred to as a "gate etch." In various implementations, this gate etch process may involve etching polysilicon having the overlying gate mask 250, where the remaining polysilicon is the shape/position of the final gate structure 210. As the gate etch proceeds through the gate material, the gate etch encounters the one or more semiconductor fins 204 that run perpendicular to the gate structure 210. The gate etch is selective to etch gate material without etching the one or more semiconductor fins 204. The gate etch may etch through the remaining gate material to a top surface of the insulating material layer 230. However, when etching through the gate material from a top surface of the one or more semiconductor fins 204 to the top surface of the insulating material layer 230, it may be desirable to maintain a vertical etch profile. Otherwise, the gate structure 210 may have a reentrant profile, with the accompanying risk of collapse, or a tapered profile, with an accompanying loss in performance. A tapered profile may result in residual material at a three-dimensional (3D) corner 260 where the gate structure 210, at least one of semiconductor fins 204, and a top surface of the insulating material layer 230 intersect. An example of how residual material may form at the 3D corner 260 is discussed in greater detail in FIGS. 3A-3B. With shrinking technology nodes and smaller pitches, challenges may exist in maintaining a vertical etch profile in the gate etch to avoid a reentrant profile or a tapered profile while maintaining the critical dimensions of the FinFET semiconductor device 200. The challenges may be more pronounced at the 3D corner 260 of the FinFET semiconductor device 200.

3D Corner Residue

Figure 3A:
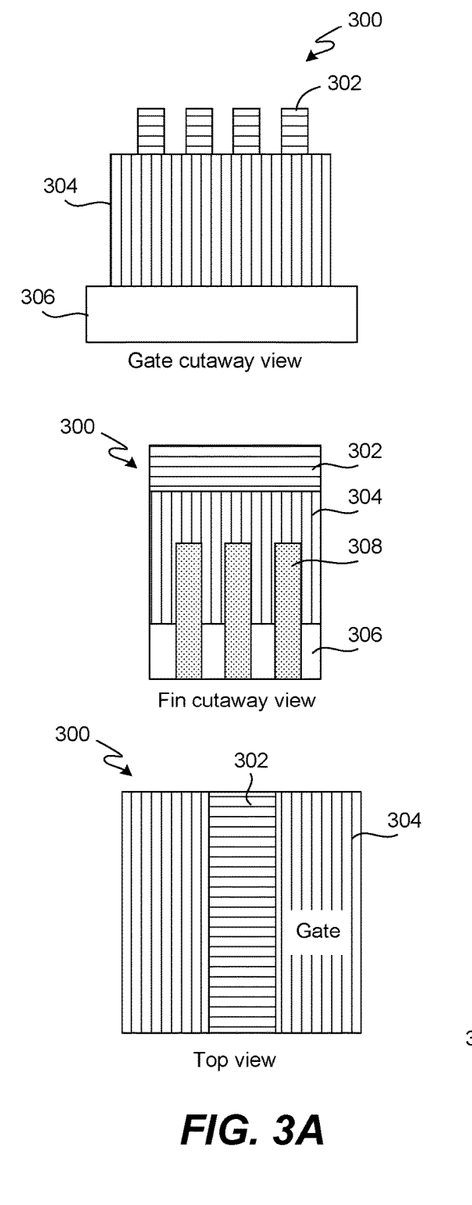
FIG. 3A shows a gate cutaway view, a fin cutaway view, and a top view of a schematic illustration of an example partially fabricated FinFET semiconductor device prior to a conventional gate etch.
Figure 3B:
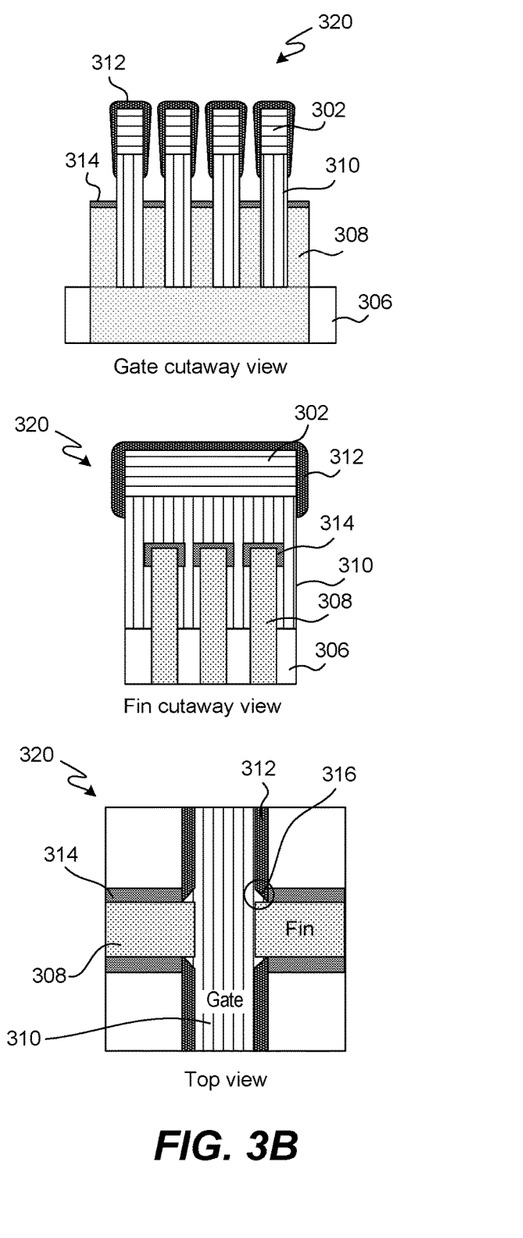
FIG. 3B shows a gate cutaway view, a fin cutaway view, and a top view of a schematic illustration of the partially fabricated FinFET semiconductor device of FIG. 5A after a conventional gate etch and byproduct re-deposition.

FIG. 3A shows a gate cutaway view, a fin cutaway view, and a top view of a schematic illustration of an example partially fabricated FinFET semiconductor device prior to a conventional gate etch. FIG. 3B shows a gate cutaway view, a fin cutaway view, and a top view of a schematic illustration of the partially fabricated FinFET semiconductor device of FIG. 3A after a conventional gate etch and byproduct re-deposition. As used herein, the gate cutaway view is a view running parallel to a gate direction. In other words, gate structures extend into and out of the page in the gate cutaway view. As used herein, the fin cutaway view is a view running parallel to a fin direction. In other words, semiconductor fins extend into and out of the page in the fin cutaway view.

Prior to performing a gate etch, a partially fabricated FinFET semiconductor device 300 may be formed defining a set of semiconductor fins 308 from a semiconductor substrate, forming an insulating material layer 306 around a lower portion of the semiconductor fins 308, forming a gate layer 304 over and around an upper portion of the semiconductor fins 308, and forming a gate mask 302 over portions of the gate layer 304. The gate mask 302 may serve as a mask in patterning the outline of gate structures 310 to be formed after the gate etch, where the semiconductor fins 308 may each run perpendicular to the gate mask 302. In some implementations, a thin layer of passivation material (not shown) may be disposed on the semiconductor fins 308 to protect the semiconductor fins during the gate etch.

The gate layer 304 may surround and cover the semiconductor fins 308 prior to the gate etch. The gate etch will etch the gate layer 304 to the top surface of the insulating material layer 306, removing the gate layer 304 without etching the semiconductor fins 308 and without etching an outline of the gate layer 304 underlying the gate mask 302. The gate etch removes the gate layer 304 and forms gate structures 310 of a FinFET semiconductor device 320 as shown in FIG. 3B. To form gate structures 310 that have a substantially vertical profile, the gate etch according to some implementations will be an anisotropic vertical etch. It is desirable to have a gate etch that substantially maintains a vertical gate profile, that minimizes loading between isolated and dense structures, and that minimizes center-to-edge non-uniformity. Furthermore, the gate etch according to some implementations will be selective to gate material over fin material or any passivation material disposed on the semiconductor fins 308. For example, an etch rate of the gate material (e.g., polysilicon) may be at least 100 times, at least 300 times, at least 500 times, or at least 1000 times greater than an etch rate of the passivation material (e.g., oxide) disposed on the semiconductor fins 308. Accordingly, it is also desirable to have a gate etch that is highly selective to the gate material against other exposed materials.

In some implementations, a conventional gate etch process may be a plasma etch process using an etchant such as a bromine-containing reagent, a chlorine-containing reagent, a fluorine-containing reagent, or combinations therefore. For example, the etchant may include chlorine ($Cl_2$), hydrogen bromide (HBr), carbon tetrafluoride ($CF_4$), sulfur hexafluoride ($SF_6$), trifluoromethane ($CHF_3$), or combinations thereof. During the conventional gate etch process of polysilicon of the gate layer 304, the etchant may react with the polysilicon to form volatile byproducts and non-volatile byproducts. For example, volatile byproducts that may form during the conventional gate etch process may include silicon tetrachloride ($SiCl_4$), silicon tetrabromide ($SiBr_4$), or combinations thereof. Non-volatile byproducts that may form during the conventional gate etch process may include silicon trichloride ($SiCl_3$), silicon dichloride ($SiCl_2$), silicon tribromide ($SiBr_3$), silicon dibromide ($SiBr_2$), or combinations thereof. In some implementations, volatile byproducts may react with high energy electrons or other species and dissociate to form the non-volatile byproducts. Such non-volatile byproducts may also be referred to as "global byproducts." The global byproducts are typically observed on the gate mask 302.

The volatile byproducts of the reaction between polysilicon and the etchant may be pumped out or otherwise removed from a processing chamber. The non-volatile byproducts of the reaction between polysilicon and the etchant may adsorb, adhere, or otherwise form on sidewalls and surfaces of the gate mask 302, the gate structures 310, and the semiconductor fins 308 during the gate etch process. The non-volatile byproducts may be deposited on sidewalls and surfaces of the gate mask 302 and gate structures 310 to form a first passivation byproduct layer 312 as shown in FIG. 3B. In addition, the non-volatile byproducts may also be deposited on sidewalls and surfaces of the semiconductor fins 308 to form a second passivation byproduct layer 314 as shown in FIG. 3B. Such non-volatile byproducts may form due to insufficient Cl/Br around an etch front to form volatile $SiCl_4$ or $SiBr_4$, and these non-volatile byproducts may be referred to as a "local byproduct." As discussed earlier, a thin passivation layer (not shown) may be disposed on at least a top surface of the semiconductor fins 308 prior to the conventional gate etch process, and the second passivation byproduct layer 314 may be added to the thin passivation layer for more protection.

The non-volatile byproducts may serve as passivating materials to protect the gate structures 310 and semiconductor fins 308 during the conventional gate etch process. Thus, the conventional gate etch process provides a plasma-based passivating technique for etch byproduct re-deposition, which can be used to maintain sidewall profile and avoid lateral etch into the gate structures 310 and the semiconductor fins 308. In some implementations, the conventional gate etch process may include a "flash" passivation process. A "flash" passivation process may refer to striking a gas such as oxygen ($O_2$), carbon dioxide ($CO_2$), and/or nitrogen ($N_2$) to form a plasma of dissociated radicals to react with a surface and form a passivating layer of material (e.g., oxide or nitride) on the surface. For example, a plasma source may apply RF power to the gas for a short amount of time that may range between about 0.5 seconds and about 5 seconds. Where the conventional gate etch process includes an oxygen "flash" passivation process, the non-volatile byproduct that forms on the sidewalls and surfaces of the gate mask 302, the gate structures 310, and the semiconductor fins 308 may include an oxide such as silicon oxychloride ($SiOCl_3$) and silicon oxybromide ($SiOBr_3$). The first passivation byproduct layer 312 and the second passivation byproduct layer 314 may include the oxide formed from the "flash" passivation process, where the oxide provides additional protection for the gate structures 310 and the semiconductor fins 308 during the conventional gate etch process.

The conventional gate etch process may be dependent on an aspect ratio of the features being etched, resulting in more non-volatile byproducts being deposited near a top of the gate structures 310 and a top of the semiconductor fins 308. Higher aspect ratios and smaller critical dimension (CD) spaces may result in more etchant and passivation from plasma reacting near the top of the gate structures 310 and the top of the semiconductor fins 308. In FIG. 3B, the first passivation byproduct layer 312 may form as a bulge or overhang at the top of the gate mask 302 and the gate structures 310, and the second passivation byproduct layer 314 may also form as a bulge or overhang at the top of the semiconductor fins 308. The first passivation byproduct layer 312 acts as a shielding mask to preserve the vertical gate profile of the gate structures 310, and the second passivation byproduct layer 314 acts as a shielding mask to protect the semiconductor fins 308. However, each of the bulges of the first passivation byproduct layer 312 and the second passivation byproduct layer 314 may block directional ions of the conventional gate etch from etching underlying portions of the gate layer 304. Specifically, the bulges of the first passivation byproduct layer 312 and the second passivation byproduct layer 314 form "shadows" over regions that directional ions may not reach. As shown in the top view of FIG. 3B, the first passivation byproduct layer 312 and the second passivation byproduct layer 314 may converge at corners 316 where the semiconductor fins 308 and the gate structures 310 intersect. The corners 316 may correspond to the 3D corners 260 in the FinFET semiconductor device 200 of FIG. 2. The shielding by the first passivation byproduct layer 312 and the shielding by the second passivation byproduct layer 314 present difficulties in removing the gate layer 304 at the 3D corner 316. This results in residual gate material at the 3D corner 316 of the FinFET semiconductor device 350, which may result in loss of performance.

Attempts to mitigate the residual gate material at the 3D corner 316 include applying an isotropic etch component in the gate etch process. While the isotropic etch component may remove at least some of the residual gate material at the 3D corner 316, the isotropic etch component may result in an uncontrollable reentrant profile and lateral CD loss.

Integrated Etch/ALD Passivation

Implementations of the present disclosure relate to a method of passivating a partially fabricated FinFET semiconductor device and performing a gate etch using in-situ ALD and etch. The in-situ ALD and etch technique for passivating and etching the FinFET semiconductor device minimizes or avoids etch byproduct re-deposition as described above. The passivation technique of the present disclosure forms a thin conformal passivation layer on surfaces and sidewalls of a gate mask, one or more gate structures, and one or more semiconductor fins. The thin conformal passivation layer may be deposited by ALD after partially etching a gate layer to one or more top surfaces of one or more corresponding semiconductor fins. The gate layer is then etched to the top surface of an insulating material layer after deposition of the thin conformal passivation layer. The gate etch and ALD operations may be performed in a plasma chamber. Thus, cycles of ALD and etch steps are performed in the same chamber or tool. In some implementations, the cycles of ALD and etch steps are performed in a plasma processing apparatus as described in FIG. 1.

The use of separate chambers for deposition and etch increases processing time, processing steps, and costs, thereby having an adverse impact on throughput. Furthermore, the use of separate chambers requires transporting substrates from one chamber to another chamber, which entails vacuum breaks and increases the likelihood of unwanted materials or particles coming into contact with the substrates. This may result in the loss of material functionality and/or integrity on the substrate. Moreover, a clean process is generally required between etch and deposition processes, where the clean process can affect material properties and structure on the substrate. For example, a dilute hydrofluoric (HF) acid clean process has an impact on mask structures and can adversely impact performance.

Figure 4A:
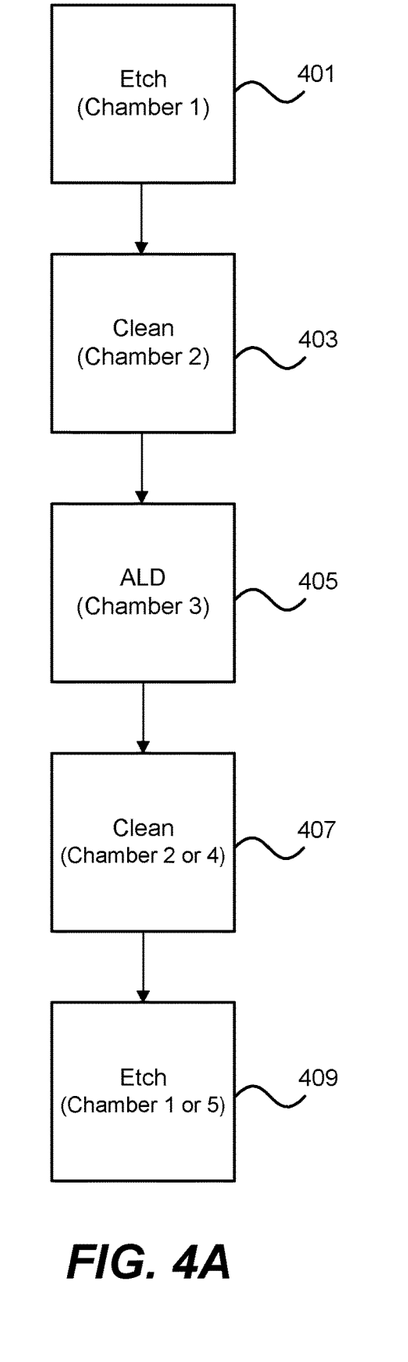
FIG. 4A shows an example process flow for substrate transport using conventional etch and ALD processes.

FIG. 4A shows an example process flow for substrate transport using conventional etch and ALD processes. It will be understood that such a process flow in FIG. 4A is not limited to gate etch schemes as discussed above, but may apply to other schemes using conventional etch and ALD processes. In FIG. 4A, a substrate is provided in an etch chamber and undergoes an etch step at block 401, transferred to a clean chamber to undergo a clean step at block 403, transferred to an ALD chamber to undergo an ALD step at block 405, transferred back to the same or different clean chamber to undergo a clean step at block 407, and transferred back to the same or different etch chamber at block 409. In performing an etch-dep-etch sequence, a substrate may undergo 4 substrate transfers through 3-5 different chambers. In some implementations, the etch step at block 401 may define a partially etch a gate layer, the ALD step at block 405 may passivate structures of a FinFET semiconductor device, and the etch step at block 409 may fully etch the gate layer to define a final gate structure of the FinFET semiconductor device.

To passivate structures of a FinFET semiconductor device while avoiding the problems associated with performing etch steps and deposition steps in different tools, a plasma etch chamber may be utilized and adapted to perform deposition. Conventional deposition processes utilized in a plasma etch chamber may include chemical vapor deposition (CVD) and plasma enhanced chemical vapor deposition (PECVD) processes. However, such deposition processes typically deposit films that are not conformal. More specifically, the deposition processes are dependent on aspect ratio and deposit more material in more open spaces or wider pitches, resulting in non-uniform deposition across structures or features of different aspect ratios. Specifically, more deposition would take place in isolated features than in dense features, where a CD bias for isolated features is greater than a CD bias for dense features.

Implementations of the present disclosure relate to the integration of ALD steps and etch steps in a plasma chamber. By using in-situ ALD rather than ALD conducted in a separate chamber and rather than using CVD/PECVD in the same chamber, standalone ALD tools and additional cleaning tools are eliminated or otherwise reduced. Furthermore, processing time and costs are reduced by eliminating additional substrate transfers and clean time. In addition, using in-situ ALD avoids vacuum breaks between substrate transfers (e.g., between ex-situ deposition and clean), which may expose the substrate to unwanted materials, atmosphere, and/or moisture. Using in-situ ALD also reduces the impact of non-uniform deposition across structures or features of different aspect ratios. In-situ ALD may refer to the ALD performed in a plasma etch chamber, such as a plasma chamber in the processing apparatus 100 of FIG. 1 described above.

Figure 4B:
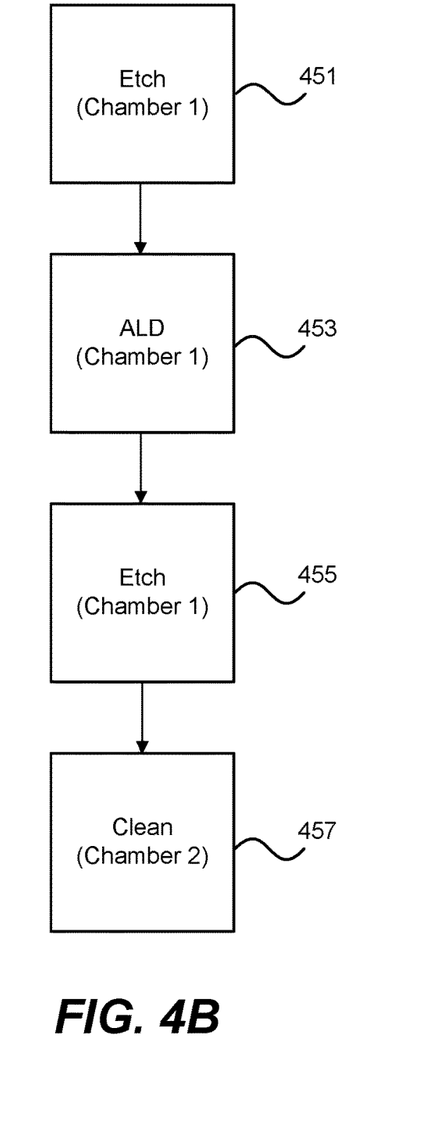
FIG. 4B shows an example process flow for substrate transport using integrated etch and ALD processes.

FIG. 4B shows an example process flow for substrate transport using integrated etch and ALD processes. It will be understood that such a process flow in FIG. 4B is not limited to gate etch schemes as discussed above, but may apply to other schemes using ALD and etch processes. In FIG. 4B, a substrate is provided in an etch chamber and undergoes an etch step at block 451, maintained in the same etch chamber to undergo an ALD step at block 453, maintained in the same etch chamber to undergo an etch step at block 455, and transferred to a clean chamber to undergo a clean step at block 457. In performing an etch-dep-etch sequence, a substrate may undergo 1 substrate transfer through 2 different chambers. In some implementations, the etch step at block 451 may partially etch a gate layer, the ALD step at block 453 may passivate structures of a FinFET semiconductor device, and the etch step at block 455 may etch the gate layer to define a final gate structure of the FinFET semiconductor device.

Figure 5:
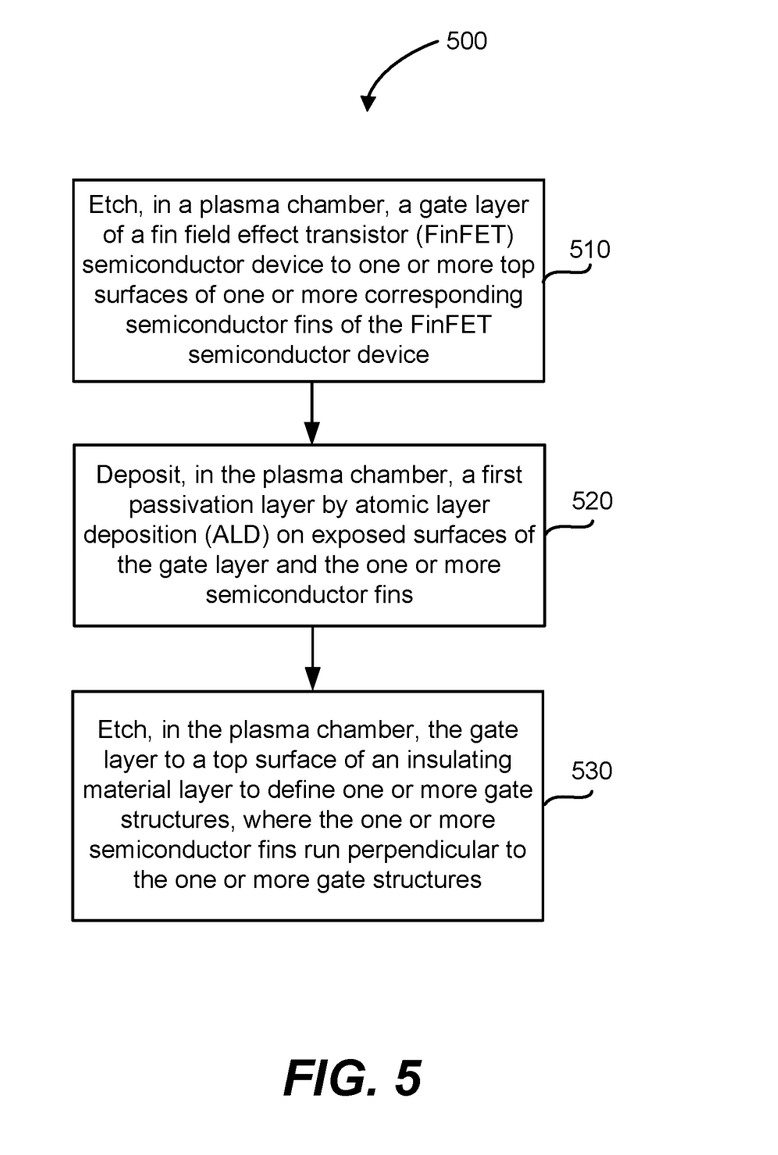
FIG. 5 is a flow diagram of an example method for passivating and forming a FinFET semiconductor device using etch and ALD processes according to some implementations.

FIG. 5 is a flow diagram of an example method for passivating and forming a FinFET semiconductor device using etch and ALD processes according to some implementations. The operations in a process 500 may be performed in different orders and/or with different, fewer, or additional operations. FIG. 5 is described with reference to FIGS. 6A-6D.

Prior to block 510 of the process 500, the process 500 may optionally include defining one or more semiconductor fins from a semiconductor substrate of a FinFET semiconductor device. The one or more semiconductor fins may be defined to extend over a top surface of an insulating material layer disposed on the semiconductor substrate. The insulating material layer may also be disposed around a lower portion of the one or more semiconductor fins. An upper portion of the one or more semiconductor fins may extend above a top surface of the insulating material layer. In some implementations, the one or more semiconductor fins and the semiconductor substrate may include a semiconducting material such as silicon, germanium, or combinations thereof. In some implementations, the insulating material layer may include an insulating material such as silicon oxide or silicon nitride. In some implementations, defining the one or more semiconductor fins may include etching the semiconductor substrate to form the shape of the fins extending from the semiconductor substrate, depositing the insulating material layer on the semiconductor substrate and around a lower portion of the one or more semiconductor fins, and planarizing the insulating material layer so that an upper portion of the one or more semiconductor fins is exposed and extends from the top surface of the insulating material layer.

In some implementations, the process 500 may optionally include depositing a gate layer over and around the upper portion of the one or more semiconductor fins after defining the one or more semiconductor fins. The gate layer may also be disposed on the top surface of the insulating material layer. The gate layer may surround and cover the upper portion of the one or more semiconductor fins. In some implementations, the gate layer may include polysilicon or metal.

In some implementations, the process 500 may optionally include forming a gate mask over the gate layer after depositing the gate layer. The gate mask may be deposited and patterned on the gate layer to mask portions of the gate layer for defining a final outline of a gate structure of the FinFET semiconductor device. The one or more semiconductor fins may run perpendicular to the gate mask on the gate layer. In some implementations, the gate mask may include a hard mask material such as silicon oxide, silicon nitride, or silicon oxynitride.

Figure 6A:
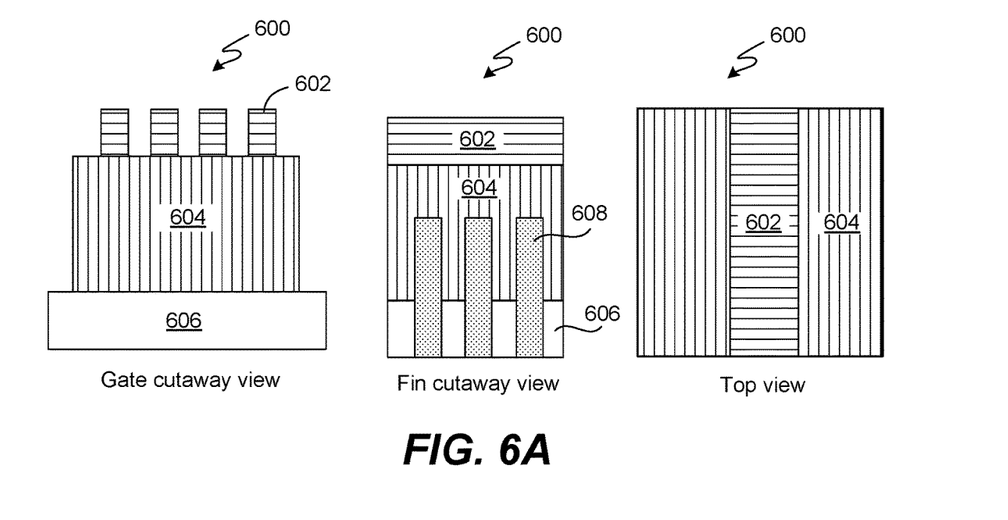
FIG. 6A shows a gate cutaway view, a fin cutaway view, and a top view of a schematic illustration of an example partially fabricated FinFET semiconductor device prior to a gate etch according to some implementations.

FIG. 6A shows a gate cutaway view, a fin cutaway view, and a top view of a schematic illustration of an example partially fabricated FinFET semiconductor device prior to a gate etch according to some implementations. Prior to performing a gate etch, a partially fabricated FinFET semiconductor device 600 may be formed by defining a set of semiconductor fins 608 from a semiconductor substrate, forming an insulating material layer 606 around a lower portion of the semiconductor fins 608, forming a gate layer 604 over and around an upper portion of the semiconductor fins 608, and forming a gate mask 602 over portions of the gate layer 604. The gate mask 602 may serve as a mask in patterning the outline of gate structures 610 to be formed after the gate etch, where the semiconductor fins 608 may each run perpendicular to the gate mask 602. The gate layer 604 may surround and cover the semiconductor fins 608 prior to the gate etch, or at least surround a top surface and sidewalls of the semiconductor fins 608 that extend longitudinally. In the top view and the gate cutaway view of FIG. 6A, the semiconductor fins 608 are not visible and are covered by the gate layer 604.

Returning to FIG. 5, at block 510 of the process 500, the gate layer of the FinFET semiconductor device is etched in a plasma chamber to one or more top surfaces of one or more corresponding semiconductor fins. The etch may stop when the one or more top surfaces of the one or more corresponding semiconductor fins is exposed. In some implementations, a layer of passivation material (e.g., oxide layer) may be disposed on the one or more semiconductor fins to protect the one or more semiconductor fins during a gate etch so that the etch may stop at the layer of passivation material. The etch performs a partial gate etch without etching a remaining gate layer in spaces between or directly adjacent to the one or more semiconductor fins. The plasma chamber may be configured to perform subsequent etch and deposition processes. Aspects of the plasma chamber may be described with respect to the processing apparatus 100 in FIG. 1.

The etch performed at block 510 may be an anisotropic plasma etch that is selective to gate material of the gate layer against other exposed materials. For example, the etch may be selective to polysilicon against hard mask material and passivating material that may be encountered during the etch. To perform the etch, plasma may be generated from a plasma generation gas including, for example, $Cl_2$, HBr, $CF_4$, $SF_6$, $CHF_3$, or combinations thereof. Accordingly, the etch performed at block 510 involves an etchant that may include a bromine-containing reagent, a chlorine-containing reagent, a fluorine-containing reagent, or combinations thereof. In some implementations, the plasma generation gas does not include an oxygen-containing gas such as $O_2$ and $CO_2$. Generally, oxygen-containing gas in a plasma process, such as a plasma-based "flash" passivation process, contributes to the formation of non-volatile etch byproduct re-deposition. This minimizes or eliminates the formation of oxide from etch byproduct re-deposition. Accordingly, the etch performed at block 510 is substantially free of an oxygen-containing gas.

In some implementations, the plasma generated in the etch performed at block 510 may be an ion-driven plasma, where an ion-driven plasma (e.g., ion-ion plasma) may contain a higher proportion of negatively charged species that are ions than electrons as compared to an electron-driven plasma (e.g., electron-ion plasma). However, it will be understood that the plasma generated in the etch at block 510 is not necessarily an ion-driven plasma. Plasma conditions may be optimized to form an ion-driven plasma. An ion-driven plasma may be applied in an anisotropic etch process with minimal impact on gate profile or CD. As the etch proceeds to the one or more top surfaces of the one or more corresponding semiconductor fins, a gate profile is maintained with minimal lateral CD loss. As used herein throughout this disclosure with respect to lateral CD loss, "minimal lateral CD loss" refers to lateral CD loss of not more than 5% of the original CD. For example, minimal lateral CD loss may refer to lateral CD loss of not more than 5 nm.

In some implementations, a plasma grid may be used to divide the plasma chamber to facilitate generation of an ion-ion plasma. An example of a plasma grid is described in U.S. Pat. No. 9,633,846 to Paterson et al., filed Nov. 30, 2015 and entitled "INTERNAL PLASMA GRID APPLICATION FOR SEMICONDUCTOR FABRICATION," which is incorporated by reference in its entirety and for all purposes. An ion-driven plasma may reduce formation of non-volatile etch byproducts in the plasma chamber, particularly non-volatile etch byproducts associated with a global byproduct.

Figure 6B:
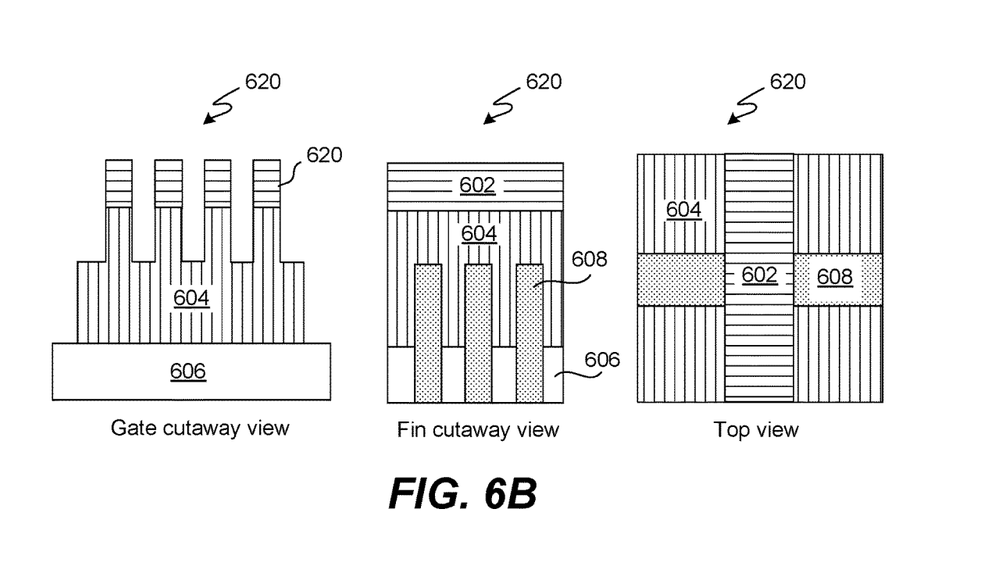
FIG. 6B shows a gate cutaway view, a fin cutaway view, and top view of a schematic illustration of the example partially fabricated FinFET semiconductor device of FIG. 6A after a first gate etch according to some implementations.

FIG. 6B shows a gate cutaway view, a fin cutaway view, and top view of a schematic illustration of the example partially fabricated FinFET semiconductor device of FIG. 6A after a first gate etch according to some implementations. At least part of the gate layer 604 is removed in a partially fabricated FinFET semiconductor device 620 after a first gate etch. Portions of the gate layer 604 are removed to top surfaces of the semiconductor fins 608. Other portions of the gate layer 604 underlying the gate mask 602 and in between spaces of and directly adjacent to the semiconductor fins 608 remain following the first gate etch. The first gate etch is selective to gate material of the gate layer 604 without significantly etching the gate mask 602 and the semiconductor fins 608, and the first gate etch is anisotropic to maintain a substantially vertical profile with respect to gate electrodes/structures to be subsequently formed. In the top view of FIG. 6B, the top surfaces of the semiconductor fins 608 are exposed and surrounded by remaining gate layer 604.

Returning to FIG. 5, at block 520 of the process 500, a first passivation layer is deposited in the plasma chamber by atomic layer deposition (ALD) on exposed surfaces of the gate layer and the one or more semiconductor fins. This includes at least sidewalls of the gate layer and the one or more top surfaces of the one or more corresponding semiconductor fins. In some implementations, the first passivation layer is at least conformally deposited on exposed surfaces (including sidewalls) of the gate mask, the gate layer, and the one or more semiconductor fins. ALD at block 520 is performed in the same plasma chamber as etch at block 510 without introducing a vacuum break in between operations.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. Unlike a CVD technique, ALD processes use surface-self-limited deposition reactions to deposit films on a layer-by-layer basis. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted reactant material or reaction byproducts from the chamber. The dose step may adsorb precursor material in a self-limiting manner such that once active sites are occupied by the precursor material, little or no additional precursor material will be adsorbed on the substrate surface. The reactant material may likewise react with the precursor material in a self-limiting or adsorption-limiting manner. Purge steps may be optionally performed to remove excess precursor material, reaction byproducts, and/or unreacted reactant material from the chamber, thereby completing an ALD cycle. ALD may be used to provide highly conformal films with high step coverage even in high aspect ratio features.

The first passivation layer may be conformally deposited by ALD on exposed surfaces of the gate mask, the gate layer, and the one or more semiconductor fins. The ALD process for conformally depositing the first passivation layer may occur in one or more cycles, where each cycle produces an adsorption-limited amount of passivation material on exposed surfaces of the gate mask, the gate layer, and the one or more semiconductor fins. Each cycle may include a dose step where a controlled amount of precursor material is delivered to a substrate surface to adsorb on the substrate surface in a self-limiting manner. This is also known as "soaking" the substrate surface to saturation. Each cycle may further include a conversion step following the dose step where reactant material is provided to react with the precursor material on the substrate surface and form an adsorption-limited amount of passivation material. The reactant material may include a reactant gas, where an RF power source generates plasma of the reactant gas in the plasma chamber. The reactant gas may include, for example, an oxygen-containing gas (e.g., $O_2$) or a nitrogen-containing gas (e.g., $N_2$ or $NH_3$). Radicals and other charged species of the reactant gas react with the precursor material to convert the precursor material to the adsorption-limited amount of passivation material. In some implementations, the reactant gas is exposed to RF power delivery in a relatively short amount of time, such as between about 0.5 seconds and about 5 seconds, to form the plasma to convert the precursor material. This is also known as a "flash" operation to convert the precursor material on the substrate surface using plasma from RF power delivered in a relatively short amount of time. In some implementations, a purge step may remove excess precursor material, reaction byproducts, and/or unreacted reactant material from the plasma chamber to complete the cycle. In some implementations, the dose step and the conversion step may be repeated until a desired thickness of the passivation layer is deposited.

The first passivation layer may include, for example, an oxide (e.g., $SiO_x$) or a nitride (e.g., $Si_xN_y$). The first passivation layer serves to protect the gate layer directly underlying the gate mask, thereby serving as a sidewall protection layer for a gate electrode/structure to be subsequently formed in the FinFET semiconductor device during a subsequent etch process such as an etch process described at block 530. Rather than forming a bulge of passivating material as described above in etch byproduct re-deposition, the first passivation layer conformally follows a gate profile for the gate electrode/structure to be subsequently formed. Put another way, the first passivation layer "freezes" the gate profile of the sidewalls in a subsequent etch process. The first passivation layer deposited on the one or more top surfaces of the one or more corresponding semiconductor fins may also add protection for the one or more semiconductor fins during a subsequent etch process such as an etch process described at block 530.

The first passivation layer is conformally deposited by ALD and may have a high step coverage, such as a step coverage of greater than 85%, greater than 90%, or greater than 95%. The high conformality of the first passivation layer provides a relatively uniform thickness of the first passivation layer along exposed surfaces of the gate mask, the gate layer, and the one or more top surfaces of the one or more corresponding semiconductor fins. The first passivation layer deposited by ALD serves to passivate the exposed surfaces and is relatively thin so as to limit impact on CD. In some implementations, the thickness of the first passivation layer may be between about 0.1 nm and about 5 nm or between about 0.5 nm and about 3 nm. In some implementations, a width of the gate mask or the gate electrode/structure to be formed is greater than the thickness of the first passivation layer. For example, the width of the gate mask is between about 5 nm and about 50 nm and the width of the gate electrode/structure to be formed is between about 5 nm and about 50 nm. Accordingly, any CD gain from deposition of the first passivation layer is minimized.

Figure 6C:
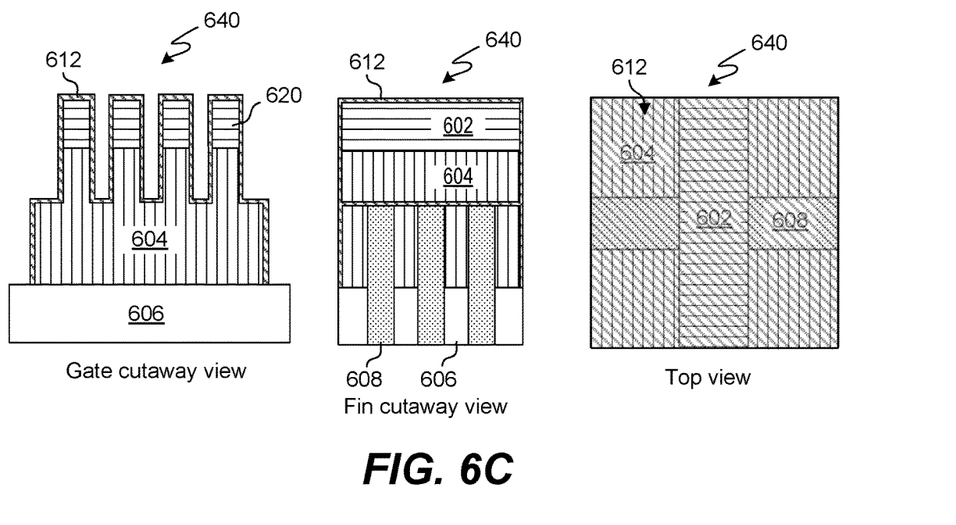
FIG. 6C shows a gate cutaway view, a fin cutaway view, and a top view of a schematic illustration of the example partially fabricated FinFET semiconductor device of FIG. 6B after ALD passivation according to some implementations.

FIG. 6C shows a gate cutaway view, a fin cutaway view, and a top view of a schematic illustration of the example partially fabricated FinFET semiconductor device of FIG. 6B after ALD passivation according to some implementations. In a partially fabricated FinFET semiconductor device 640, a passivation layer 612 is deposited on exposed surfaces (including sidewalls) of the gate mask 602, the gate layer 604, and the semiconductor fins 608. This includes sidewalls of the gate layer 604 underlying the gate mask 602 and the top surface of the semiconductor fins 608. The passivation layer 612 is relatively thin and conformal along the exposed surfaces of the gate mask 602, the gate layer 604, and the semiconductor fins 608, conformally following a vertical profile of the gate layer 604 underlying the gate mask 602. In the top view of FIG. 6C, the top surfaces of the semiconductor fins 608, the gate layer 604, and the gate mask 602 are covered by the passivation layer 612.

Returning to FIG. 5, at block 530 of the process 500, the gate layer of the FinFET semiconductor device is etched in the plasma chamber to a top surface of the insulating material layer to define one or more gate structures, where the one or more semiconductor fins run perpendicular to the one or more gate structures. The etch may eventually stop when the top surface of the insulating material layer is exposed. Etch at block 530 is performed in the same plasma chamber as etch at block 510 and deposition at block 520 without introducing a vacuum break in between operations.

The etch performs a gate etch that removes the remaining gate layer in spaces between or directly adjacent to the one or more semiconductor fins. The etch forms recesses, trenches, or features in the spaces between the one or more semiconductor fins. The etch performed at block 530 may be an anisotropic plasma etch that minimizes formation of a reentrant profile or tapered profile in the one or more semiconductor fins and the one or more gate structures. The etch maintains the gate profile of the one or more gate structures with minimal lateral CD loss. The etch also maintains the fin profile of the one or more semiconductor fins with minimal lateral CD loss. Even in very small CD spaces (e.g., equal to or less than about 8 nm), very little to no residual gate material remains following the etch at block 530. In some implementations, the etch removes residual gate material at 3D corners where the one or more gate structures, the one or more semiconductor fins, and a top surface of the insulating material layer intersect.

Like the etch performed at block 510, the etch performed at block 530 is selective to gate material of the gate layer against other exposed materials (e.g., the first passivation layer) and may be free of an oxygen-containing gas. To perform the etch, plasma may be generated from a plasma generation gas including, for example, $Cl_2$, HBr, $CF_4$, $SF_6$, $CHF_3$, or combinations thereof. Accordingly, the etch performed at block 530 involves an etchant that may include a bromine-containing reagent, a chlorine-containing reagent, a fluorine-containing reagent, or combinations thereof. In some implementations, the plasma generation gas does not include an oxygen-containing gas such as $O_2$ and $CO_2$, thereby minimizing or eliminating the formation of oxide from etch byproduct re-deposition. In some implementations, the plasma generated in the etch performed at block 530 may be an ion-driven plasma.

Even though the etch at block 530 may be performed as a single etch operation, it will be understood that the etch at block 530 may be performed as one or more etch-dep-etch operations. In other words, a partial gate etch may proceed partly through a first portion the gate layer to a certain depth and followed by an ALD passivation process before resuming the gate etch through a second portion of the gate layer. In some implementations, the etch at block 530 includes etching a first portion of the gate layer partially to a first depth in the plasma chamber, depositing by ALD a second passivation layer on at least exposed surfaces (including sidewalls) of the gate layer and the one or more semiconductor fins in the plasma chamber, and etching a second portion of the gate layer fully or partially to a second depth in the plasma chamber. This etch-dep-etch sequence may be repeated until the gate layer is removed to a desired depth reaching the top surface of the insulating material layer. This sequence may be repeated in the same plasma chamber without introducing a vacuum break in between operations.

The second passivation layer deposited by ALD may serve as a sidewall protection layer to protect the one or more semiconductor fins during a gate etch. Rather than forming a bulge of passivating material as described above in etch byproduct re-deposition, the second passivation layer conformally follows a fin profile for the one or more semiconductor fins. Put another way, the second passivation layer "freezes" the fin profile of the sidewalls in a subsequent etch process.

Figure 6D:
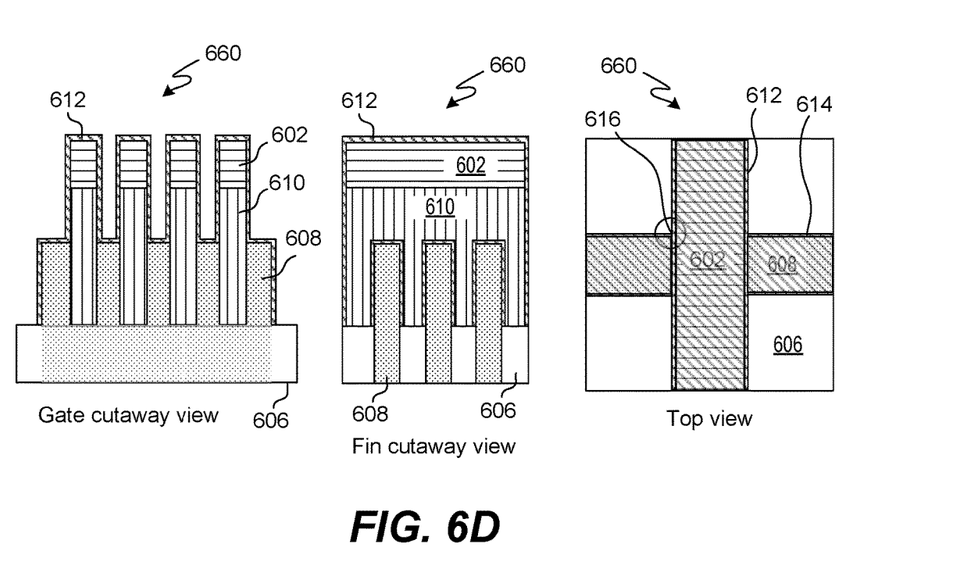
FIG. 6D shows a gate cutaway view, a fin cutaway view, and a top view of a schematic illustration of the example FinFET semiconductor device of FIG. 6C after a second gate etch according to some implementations.

FIG. 6D shows a gate cutaway view, a fin cutaway view, and a top view of a schematic illustration of the example FinFET semiconductor device of FIG. 6C after a second gate etch according to some implementations. A FinFET semiconductor device 660 includes a final outline of gate structures 610 following a second gate etch. The second gate etch removes gate layer 604 to the top surface of the insulating material layer 606 to expose the semiconductor fins 608 and form the gate structures 610. The semiconductor fins 608 run perpendicular to the gate structures 610. At corners 616 where the semiconductor fins 608 intersect the gate structures 610, there is little to no residual gate material from the gate layer 604. The second gate etch substantially removes residual gate material from the corners 616. The passivation layer 612 may maintain a gate profile of the gate structures 610 during the second gate etch with minimal lateral CD loss. The gate profile of the gate structures 610 following the second gate etch may be substantially vertical. In some implementations, an additional passivation layer 614 may be deposited on sidewalls of the semiconductor fins 608 to maintain a fin profile of the semiconductor fins 608 during the second gate etch with minimal lateral CD loss. The additional passivation layer 614 may be conformally deposited by ALD between etch operations of the second gate etch and follow a fin profile of the semiconductor fins 608. One or both of the passivation layer 612 and the additional passivation layer 614 provide robust protection for the gate structures 610 and the semiconductor fins 608 during etch operations without forming "shadows" over regions that directional ions may not reach. In the top view of FIG. 6C, the insulating material layer 630 is exposed and the passivation layers 612, 614 are formed along sidewalls of the gate structures 610 and the semiconductor fins 608.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    etching, in a plasma chamber, a gate layer of a fin field effect transistor (FinFET) semiconductor device to expose top surfaces of one or more semiconductor fins of the FinFET semiconductor device;
    depositing, in the plasma chamber after etching the gate layer to exposed top surfaces of the one or more semiconductor fins, a first passivation layer by atomic layer deposition (ALD) on exposed surfaces of the gate layer and the one or more semiconductor fins; and
    etching, in the plasma chamber after depositing the first passivation layer by ALD, the gate layer to expose a top surface of an insulating material layer of the FinFET semiconductor device to define one or more gate structures in the FinFET semiconductor device and expose sidewalls of the one or more semiconductor fins, wherein the one or more semiconductor fins run perpendicular to the one or more gate structures.

2. The method of claim 1, wherein the gate layer includes polysilicon.

3. The method of claim 1, wherein etching the gate layer to expose the top surface of the insulating material layer comprises:
    etching, in the plasma chamber, a first portion of the gate layer to a first depth above the top surface of the insulating material layer;
    depositing, in the plasma chamber, a second passivation layer by ALD on the exposed surfaces of the gate layer and the one or more semiconductor fins; and
    etching, in the plasma chamber, a second portion of the gate layer to a second depth to expose the top surface of the insulating material layer.

4. The method of claim 1, further comprising:
    defining the one or more semiconductor fins from a semiconductor substrate prior to etching the gate layer to expose the top surfaces of the one or more semiconductor fins; and
    depositing the gate layer over and around an upper portion of the one or more semiconductor fins before etching the gate layer to expose the top surfaces of the one or more semiconductor fins.

5. The method of claim 1, further comprising:
    forming a gate mask over the gate layer prior to etching the gate layer to expose the top surfaces of the one or more semiconductor fins, the gate mask defining regions for forming the one or more gate structures.

6. The method of claim 5, wherein the first passivation layer is conformally deposited on sidewalls of the gate layer underlying the gate mask.

7. The method of claim 1, wherein a thickness of the first passivation layer is between about 0.5 nm and about 3 nm and a width of each of the gate structures is between about 5 nm and about 50 nm.

8. The method of claim 1, wherein operations of etching the gate layer to expose the top surfaces of the one or more semiconductor fins, depositing by ALD, and etching the gate layer to expose the top surface of the insulating material layer in the plasma chamber are performed without introducing a vacuum break in between operations.

9. The method of claim 1, wherein an etchant is substantially free of an oxygen-containing gas in each of etching the gate layer to expose the top surfaces of the one or more semiconductor fins and etching the gate layer to expose the top surface of the insulating material layer.

10. The method of claim 9, wherein the etchant includes a bromine-containing reagent, a chlorine-containing reagent, or combinations thereof.

11. The method of claim 1, wherein a profile of the one or more gate structures is substantially vertical after etching the gate layer to expose the top surface of the insulating material layer.

12. The method of claim 1, wherein etching the gate layer to expose the top surfaces of the one or more semiconductor fins and etching the gate layer to expose the top surface of the insulating material layer occur with minimal lateral critical dimension (CD) loss.

13. The method of claim 1, wherein etching the gate layer to expose the top surface of the insulating material layer removes the gate layer from each corner where the one or more gate structures, the one or more semiconductor fins, and the insulating material layer intersect.

14. The method of claim 1, wherein the top surfaces of the one or more semiconductor fins include an oxide layer prior to etching the gate layer to expose the top surfaces of the one or more semiconductor fins.

15. The method of claim 1, wherein the one or more gate structures are parallel to one another and the one or more semiconductor fins are parallel to one another, the one or more semiconductor fins extending through the one or more gate structures.

16. The method of claim 1, wherein the first passivation layer includes silicon oxide ($SiO_x$).

17. The method of claim 1, wherein depositing the first passivation layer by ALD includes:
    introducing a precursor into the plasma chamber to adsorb on the gate layer and the top surfaces of the one or more semiconductor fins,
    converting the precursor with a plasma to form an adsorption-limited amount of the first passivation layer, and
    repeating operations of introducing the precursor and converting the precursor until a desired thickness of the first passivation layer is deposited on the exposed surfaces of the gate layer and the one or more semiconductor fins.

* * * * *